(12) United States Patent
Yip et al.

(10) Patent No.: US 9,978,663 B2
(45) Date of Patent: May 22, 2018

(54) INTEGRATED CIRCUIT ASSEMBLY WITH HEAT SPREADER AND METHOD OF MAKING THE SAME

(71) Applicant: SAMSUNG DISPLAY CO., LTD., Yongin-si, Gyeonggi-Do (KR)

(72) Inventors: T. Gary Yip, San Jose, CA (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 14/964,460

(22) Filed: Dec. 9, 2015

(65) Prior Publication Data

US 2017/0170164 A1 Jun. 15, 2017

(51) Int. Cl.
| | |
|---|---|
| *H01L 23/373* | (2006.01) |
| *H01L 23/00* | (2006.01) |
| *H01L 23/498* | (2006.01) |
| *H01L 27/02* | (2006.01) |

(52) U.S. Cl.
CPC ...... *H01L 23/373* (2013.01); *H01L 23/49855* (2013.01); *H01L 24/06* (2013.01); *H01L 27/0248* (2013.01)

(58) Field of Classification Search
CPC ..... H01L 23/4985; H01L 24/14; H01L 24/83; H01L 24/06; H01L 23/49811; H01L 23/49855; H01L 23/373; H01L 24/32; H01L 51/0097
See application file for complete search history.

(56) References Cited

U.S. PATENT DOCUMENTS

| | | | |
|---|---|---|---|
| 6,949,415 B2* | 9/2005 | Alcoe | H01L 23/10 257/E23.135 |
| 7,254,031 B2 | 8/2007 | Kim et al. | |
| 7,911,050 B2 | 3/2011 | Nakajima | |
| 8,017,873 B2 | 9/2011 | Wu | |
| 8,134,227 B2* | 3/2012 | Tay | H01L 25/03 257/685 |
| 8,344,486 B2 | 1/2013 | Nakagawa et al. | |
| 8,373,192 B2* | 2/2013 | Sugizaki | H01L 25/0753 257/79 |
| 8,508,056 B2 | 8/2013 | Kim et al. | |
| 8,564,954 B2 | 10/2013 | Huang et al. | |
| 8,575,746 B2 | 11/2013 | Lee et al. | |
| 8,643,155 B2 | 2/2014 | Liao et al. | |
| 2002/0079572 A1* | 6/2002 | Khan | H01L 23/3677 257/707 |
| 2005/0047094 A1* | 3/2005 | Hsu | H01L 23/367 361/704 |

(Continued)

FOREIGN PATENT DOCUMENTS

| | | |
|---|---|---|
| JP | 2002-124607 A | 4/2002 |
| KR | 10-078590 B1 | 12/2007 |

*Primary Examiner* — Alonzo Chambliss
(74) *Attorney, Agent, or Firm* — Lewis Roca Rothgerber Christie LLP

(57) ABSTRACT

According to some embodiments of the present invention, a display device includes: a display panel; and an integrated circuit (IC) assembly coupled to the display panel, the IC assembly comprising: a flexible substrate; a first flexible thermally conductive layer on the flexible substrate; and an IC chip on the flexible substrate and thermally coupled to the first flexible thermally conductive layer.

20 Claims, 9 Drawing Sheets

(56) References Cited

U.S. PATENT DOCUMENTS

| | | |
|---|---|---|
| 2005/0121796 A1* | 6/2005 | Park .................. H01L 23/49838 |
| | | 257/773 |
| 2005/0139997 A1* | 6/2005 | Chou .................. H01L 23/3128 |
| | | 257/712 |
| 2006/0071325 A1 | 4/2006 | Tanaka |
| 2007/0200224 A1* | 8/2007 | Zhou ...................... H01L 23/36 |
| | | 257/707 |
| 2008/0088039 A1 | 4/2008 | Lee et al. |
| 2016/0181346 A1* | 6/2016 | Kwon .................. H01L 27/3276 |
| | | 257/40 |

* cited by examiner

INTEGRATED CIRCUIT ASSEMBLY WITH HEAT SPREADER AND METHOD OF MAKING THE SAME

FIELD

Embodiments of the present invention relate to an integrated circuit assembly with a heat spreader and a method of making the same.

BACKGROUND

As technology has progressed, so too has consumer demand for display devices with large display areas capable of displaying high quality images. Modern display devices are larger, brighter, and provide higher quality images than ever before. At the same time, the housing for display devices has generally become more compact to enable display devices to have relatively slim profiles. The reduced area within the housing of display devices may lead to components being positioned closely together, with little space for air flow and cooling mechanisms within the housing. Additionally, as modern display devices require ever higher data rates to be transmitted by internal components, there is a concern that components may become overheated or damaged.

The above information disclosed in this Background section is only to enhance the understanding of the background of the disclosure, and therefore it may contain information that does not constitute prior art.

SUMMARY

Aspects of embodiments of the present invention relate to an integrated circuit assembly with a heat spreader and a method of making the same.

According to some embodiments of the present invention, a display device includes: a display panel; and an integrated circuit (IC) assembly coupled to the display panel, the IC assembly including: a flexible substrate; a first flexible thermally conductive layer on the flexible substrate; and an IC chip on the flexible substrate and thermally coupled to the first flexible thermally conductive layer.

According to some embodiments, the first flexible thermally conductive layer is between the IC chip and the flexible substrate.

According to some embodiments, the display device further includes a thermally conductive material in contact with a surface of the IC chip and a surface of the first flexible thermally conductive layer.

According to some embodiments, the thermally conductive material includes a thermally conductive bump.

According to some embodiments, the thermally conductive material includes a second flexible thermally conductive layer.

According to some embodiments, the first flexible thermally conductive layer includes a mesh structure.

According to some embodiments, the display device further includes a second flexible thermally conductive layer on the IC chip such that the IC chip is between the first flexible thermally conductive layer and the second flexible thermally conductive layer.

According to some embodiments, the second flexible thermally conductive layer includes a mesh structure.

According to some embodiments, the second flexible thermally conductive layer includes a solid region overlapping the IC chip with the mesh structure located outside the solid region.

According to some embodiments, the display device further includes a housing, wherein the IC assembly is configured to be flexed to fit within the housing without damaging mechanical and electrical connections of the IC assembly.

According to some embodiments of the present invention, an integrated circuit (IC) assembly includes: a flexible substrate; a first flexible thermally conductive layer on the flexible substrate; and an IC chip on the flexible substrate and thermally coupled to the first flexible thermally conductive layer.

According to some embodiments, the first flexible thermally conductive layer is between the IC chip and the flexible substrate.

According to some embodiments, the display device further includes a thermally conductive material in contact with a surface of the IC chip and a surface of the first flexible thermally conductive layer.

According to some embodiments, the first flexible thermally conductive layer includes a mesh structure.

According to some embodiments, the display device further includes a second flexible thermally conductive layer on the IC chip such that the IC chip is between the first flexible thermally conductive layer and the second flexible thermally conductive layer.

According to some embodiments of the present invention, in a method of making an integrated circuit (IC) assembly, the method includes: positioning a first flexible thermally conductive layer on a flexible substrate; mounting an IC chip on the flexible substrate; and thermally connecting the IC chip to the first flexible thermally conductive layer.

According to some embodiments, the first flexible thermally conductive layer is between the IC chip and the flexible substrate.

According to some embodiments, the method further includes positioning a thermally conductive material in contact with a surface of the IC chip and a surface of the first flexible thermally conductive layer.

According to some embodiments, the method further includes positioning a second flexible thermally conductive layer on the IC chip such that the IC chip is between the first flexible thermally conductive layer and the second flexible thermally conductive layer.

According to some embodiments, the method further includes flexing the IC assembly into a flexed IC assembly without damaging mechanical and electrical connections of the IC assembly; and mounting the flexed IC assembly within a housing of a display device.

BRIEF DESCRIPTION OF THE DRAWINGS

A more complete appreciation of the present invention, and many of the attendant features and aspects thereof, will become more readily apparent with reference to the following detailed description when considered in conjunction with the accompanying drawings in which like reference symbols indicate like components, wherein.

DETAILED DESCRIPTION

Figure 1:
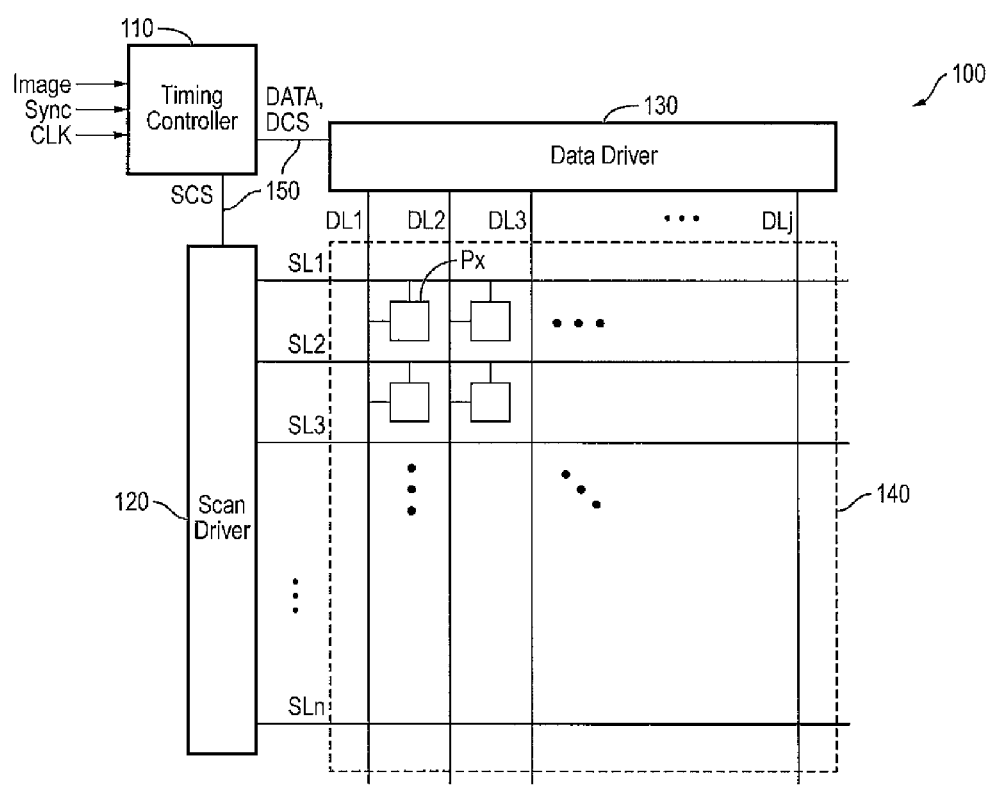
FIG. 1 illustrates an example of a display device according to embodiments of the present invention.

Aspects and features of embodiments of the present invention and methods of accomplishing the same may be understood more readily by reference to the following detailed description of embodiments and the accompanying drawings.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those having ordinary skill in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer or section described below could be termed a second element, component, region, layer, or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Display devices have become a ubiquitous part of modern life, and are found in many different electronic devices for conveying information and display images to users. As technology has progressed, so too has the ability to manufacture display devices with relatively smaller profiles and a wide range of screen sizes at relatively lower cost.

From one generation of display technology to the next, the rate of data transmission to and within display devices has increased significantly in order to take fully advantage of higher resolution display panels capable of generating images with high dynamic range brightness, high contrast ratio, and wide color ranges.

At the same time, there is high consumer demand for display devices that have a very slim profile, despite the large screen size. Thus, the amount of space available for the electronic components that drive display devices may be relatively small compared to previous generations of display devices. The small and tight spaces within the housing of modern flat panel display devices leaves little room between components to allow significant air flow or cooling. The high rates of data transmission through components that are packed into small areas within the display panel housing may cause damage to certain electronic components that generate or are exposed to significant heat during operation.

For example, once certain power consumption levels are reached by an integrated circuit (IC) chip for driving a display device, the circuitry within the IC chip may become too hot for proper operation due to the high levels of heat that can be generated. Without some amount of cooling, the driver IC for a modern display device may become physically damaged or may degrade the quality of the images displayed (e.g., by distorting colors of the pixels) and the high level of heat may even be a safety hazard for consumers.

Additionally, in order to fit the driver IC into the housing of a display device, the driver IC may be mounted on a thin film flexible substrate, as opposed to a rigid substrate, to enable the placement and shape of the substrate to conform to the limited available space within the housing. By maintaining such flexibility of the thin film flexible substrate, however, it becomes difficult to mount a traditional heat sink to the driver IC to facilitate cooling. Additionally, the lack of air flow in the tight environment of modern flat panel display devices makes overheating of IC components a concern.

Accordingly, aspects of embodiments of the present invention relate to an IC assembly with a heat spreader on a flexible substrate (e.g., a thin film flexible substrate), and a method of making the same.

FIG. 1 illustrates an example of a display device according to embodiments of the present invention. Referring to FIG. 1, a display device 100 may include a timing controller 110, a scan driver 120, a data driver 130, and a plurality of pixels Px in a display panel 140. Each of the plurality of pixels Px is coupled to respective ones of scan lines SL1 to SLn, where n is a positive integer, and data lines DL1 to DLj, where j is a positive integer, at crossing regions of the scan lines SL1 to SLn and the data lines DL1 to DLj. Each of the pixels Px receives a data signal from the data driver 130 through the respective one of the data lines DL1 to DLj, when a scan signal is received from the scan driver 120 through a respective one of the scan lines SL1 to SLn.

The timing controller 110 receives an image signal Image, a synchronization signal Sync, and a clock signal CLK from an external source (e.g., external to the timing controller). The timing controller 110 generates image data DATA, a data driver control signal DCS, and a scan driver control signal SCS. The synchronization signal Sync may include a vertical synchronization signal V sync and a horizontal synchronization signal Hsync. The timing controller 110 transmits the image data DATA and the data driver control signal DCS to the data driver 130, and transmits the scan driver control signal SCS to the scan driver 120.

Figure 2:
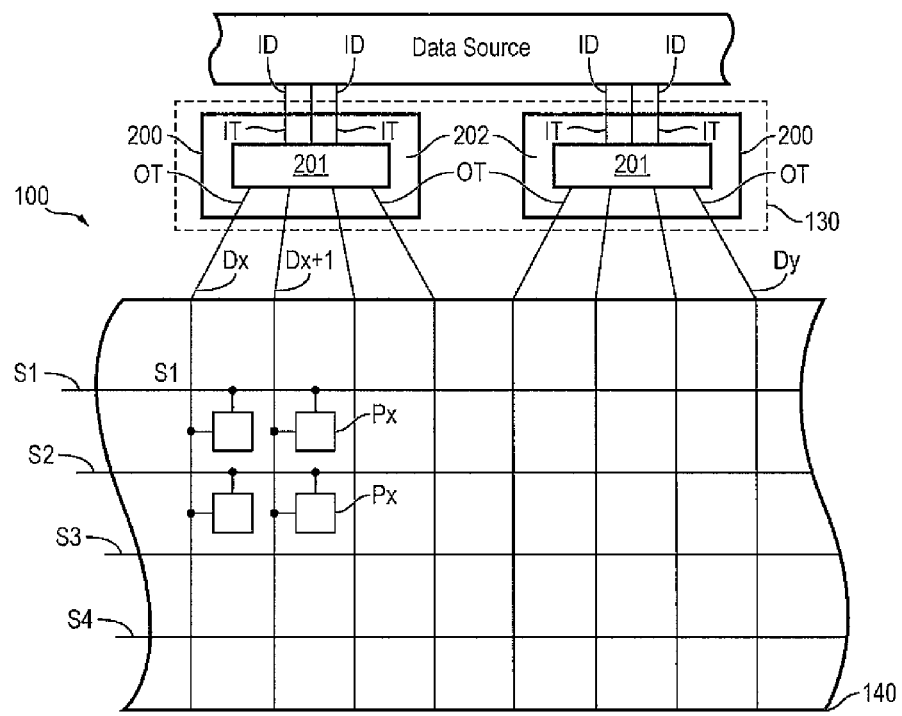
FIG. 2 illustrates further detail of the display device according to embodiments of the present invention.

FIG. 2 illustrates further detail of the display device 100 according to embodiments of the present invention. As shown in FIG. 2, the display device 100 may include a plurality of integrated circuit (IC) assemblies 200 configured to transmit data from a data source to other components of the display device 100. For example, as illustrated in FIG. 2, the data driver 130 may include one or more IC assemblies 200 for transmitting data from a data source (e.g., the timing controller 110) to the pixels Px by way of the data lines. Each of the IC assemblies 200 includes an IC chip 201 (e.g., a driver IC) configured to deserialize or demultiplex the incoming data stream (e.g., received from the data source) and transmit the deserialized or demultiplexed data stream to the data lines. The IC assemblies 200 further include a thin film substrate 202 on which the IC chip 201 is mounted (e.g., in a chip-on-film configuration). As will be discussed in more detail below, the thin film substrate 202 includes a plurality of input traces IT and a plurality of output traces OT.

Each of the IC assemblies 200 may receive incoming data from the data source through a plurality of incoming data lines ID electrically connected to the input traces IT of the IC assemblies 200. The input traces IT are then electrically connected to input data pads (shown in more detail below) of the IC chip 201 which transmits the deserialized or demultiplexed data through a plurality of output data pads (shown in more detail below) to output traces OT. Each of the output traces OT is electrically connected to a data line (e.g., $D_x$, $D_{x+1}$, ... $D_y$, etc.) from among the data lines DL1 through DLj for transmission of the data signals to the pixels Px.

Although FIG. 2 illustrates only two IC assemblies 200 transmitting data from the data source to data lines Dx through Dy, among the data lines DL1 to DLj, embodiments of the present invention are not limited thereto, and the display device 100 may include any suitable number of IC assemblies 200 according to the design and function of the display device 100. Additionally, although the IC assemblies 200 are illustrated as being incorporated within a data driver 130, embodiments of the present invention are not limited thereto, and the IC assemblies 200 of the present invention may be externally located with respect to a data driver chip, and may be incorporated into or utilized in conjunction with any other suitable components (e.g., the scan driver 120) of the display device 100 according to the design and function of the display device 100.

As discussed above, during operation of the display device 100, a significant amount of heat may be generated within the IC chips 201 due to relatively high data transmission rates. For example, according to some embodiments, the IC chips 201 may have multiple data lines operating between 5 and 10 Gbps per data link. Such high data rates can cause, under certain operating conditions, enough heat to be generated in the IC chips 201, that the IC chips 201 may be physically damaged without proper cooling. Because the IC chips 201 have a relatively small surface area, however, there is a correspondingly small area for proper dissipation of heat to avoid damage to the IC chips 201.

Accordingly, embodiments of the present invention provide a system and method for spreading and dissipating heat generated in the IC chips 201 in a manner that is sufficient to avoid or reduce instances of damage to the IC chips 201.

Figure 3A:
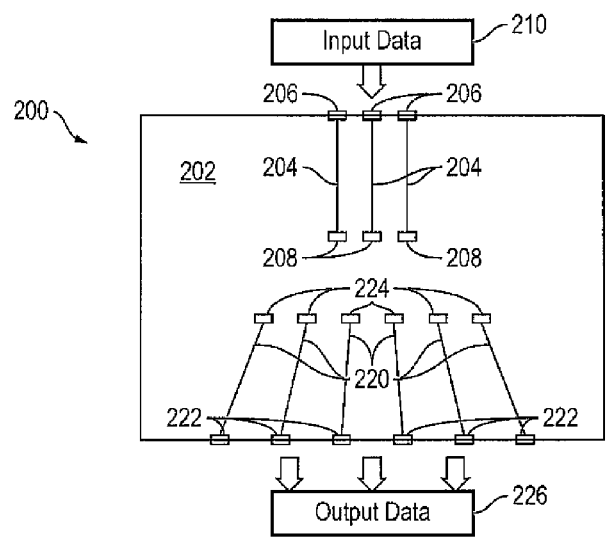
FIGS. 3A-3Q illustrate, in relation to FIGS. 1 and 2, further detail of the display device and an integrated circuit assembly for the display device, and a process of making the same, according to some embodiments of the present invention.
Figure 3B:
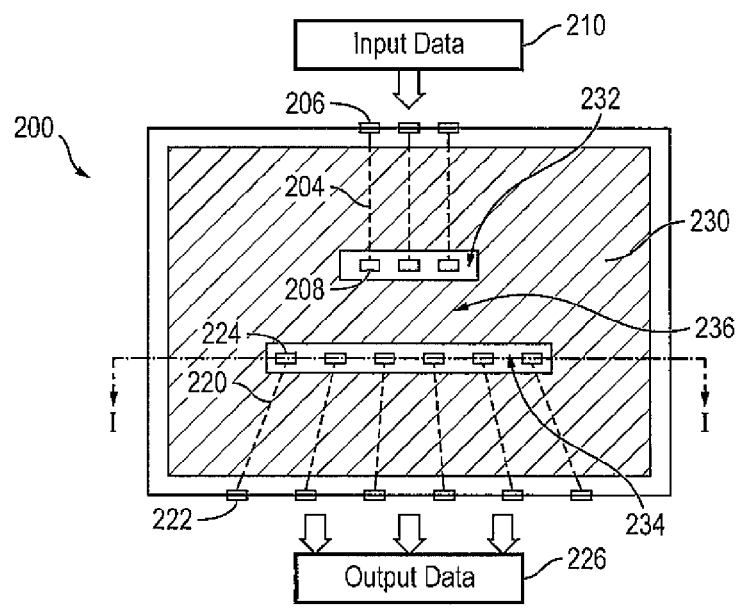
Figure 3C:
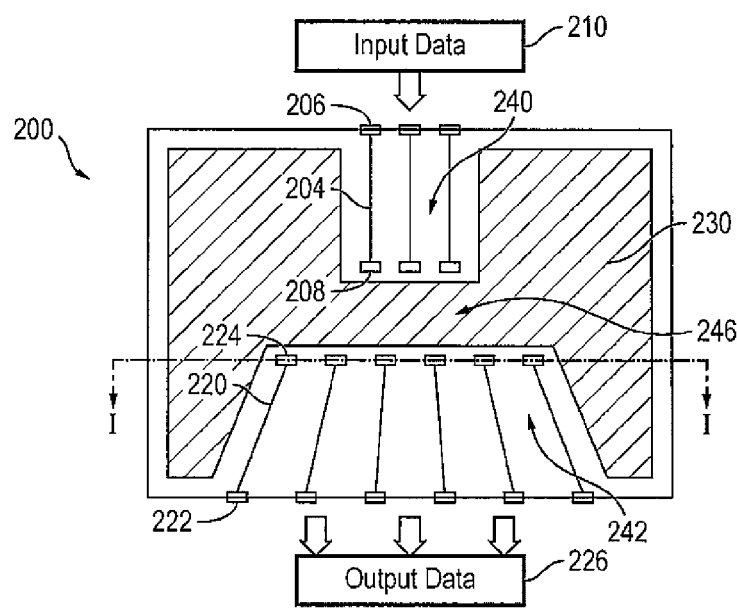
Figure 3D:
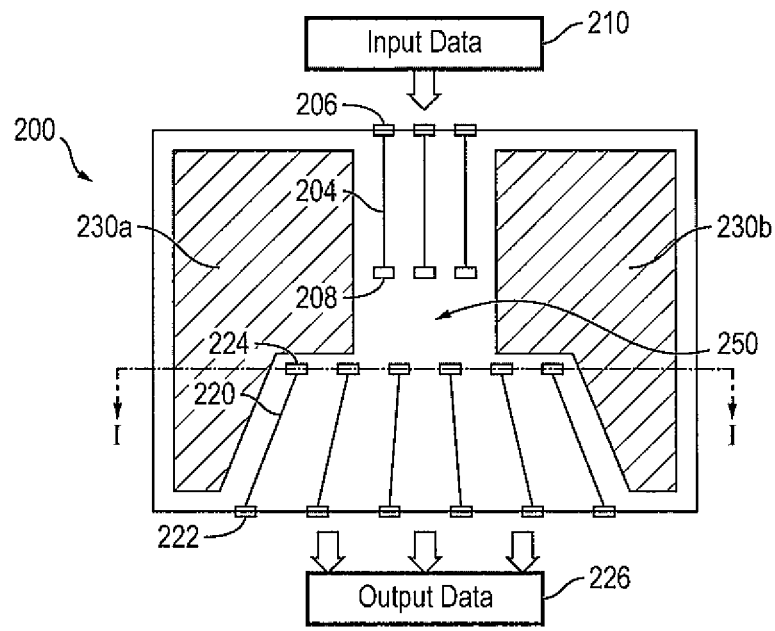
Figure 3E:
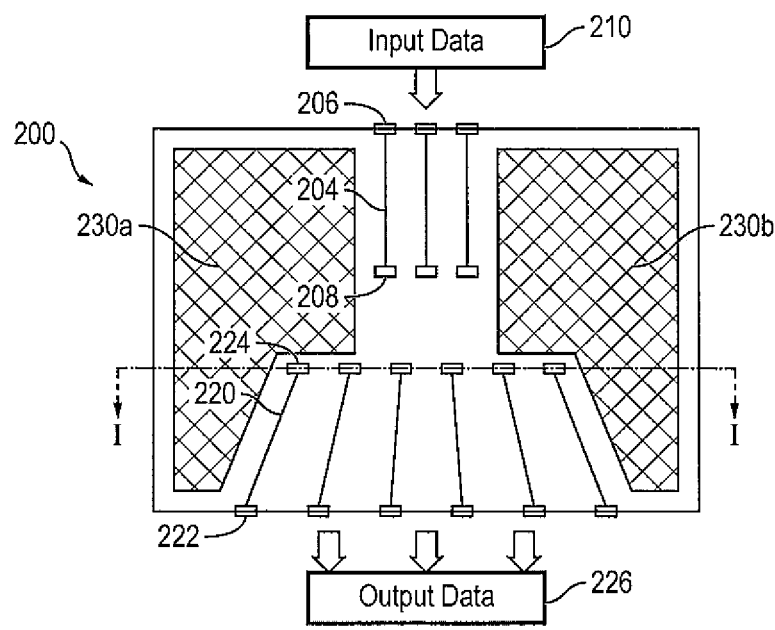
Figure 3F:
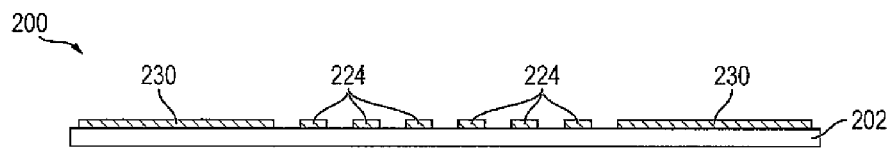
Figure 3G:
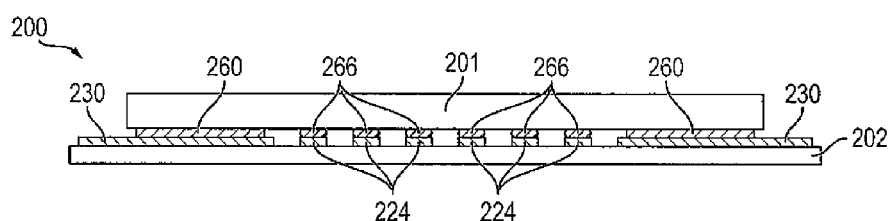
Figure 3H:
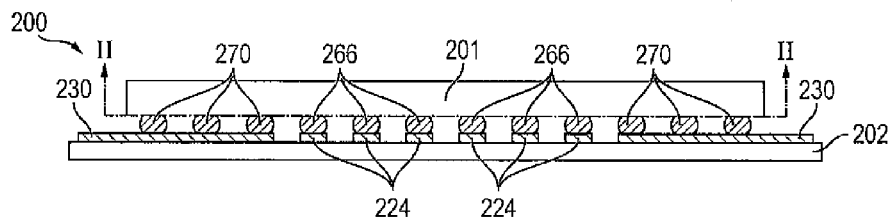
Figure 3I:
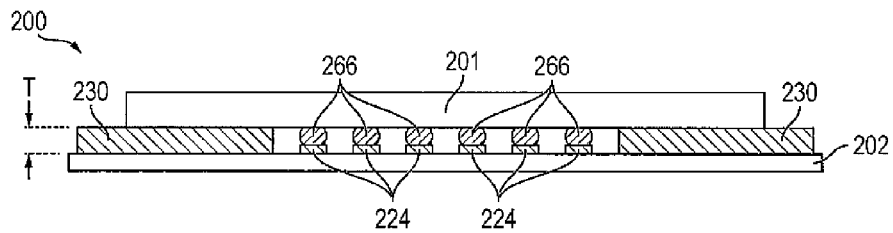
Figure 3J:
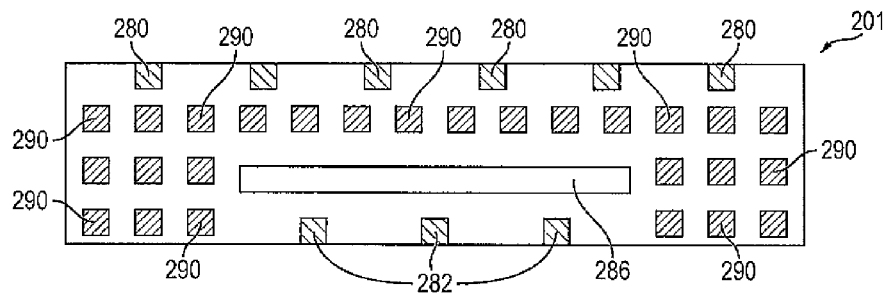
Figure 3K:
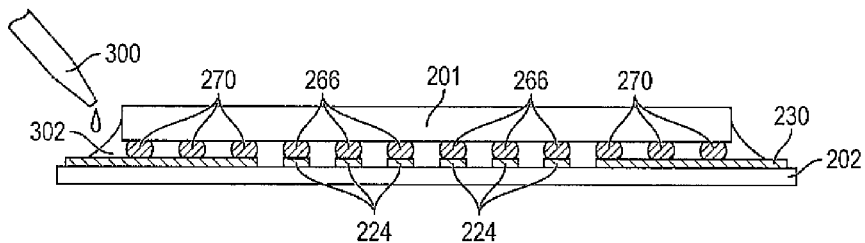
Figure 3L:
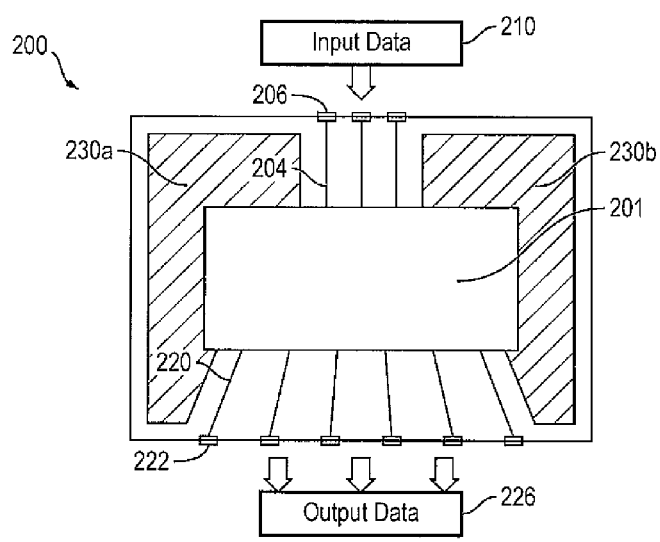
Figure 3M:
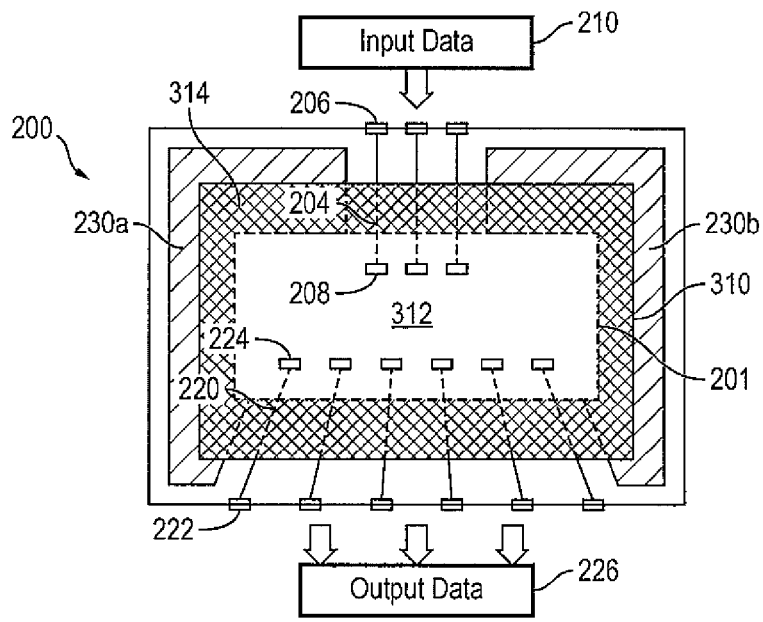
Figure 3N:
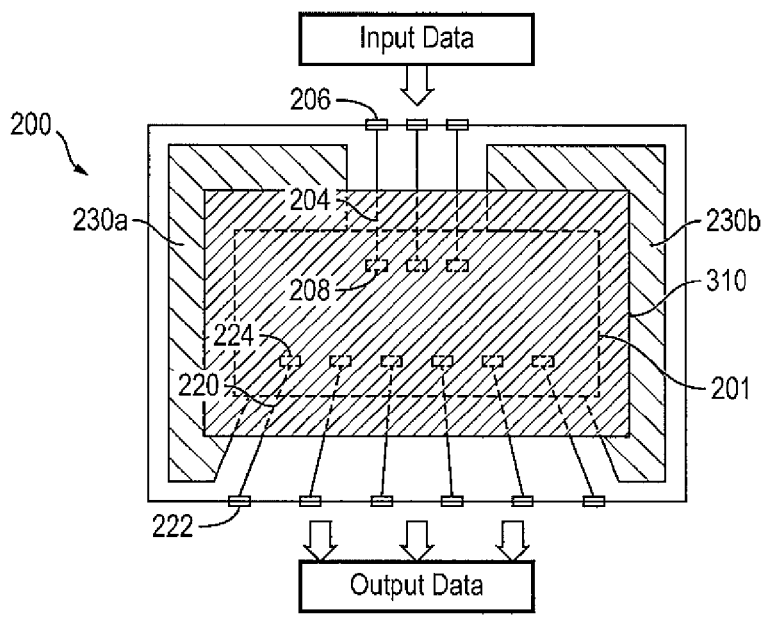
Figure 3O:
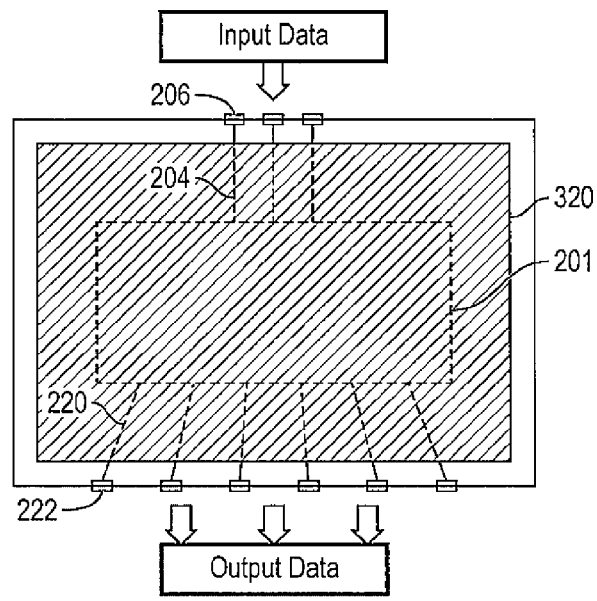
Figure 3P:
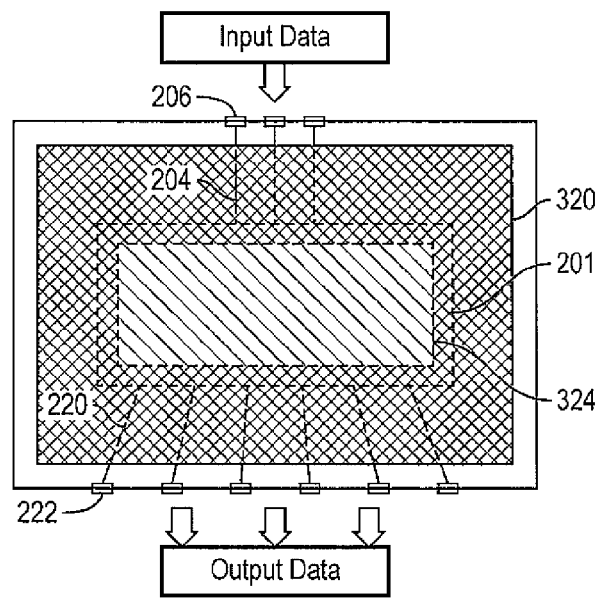
Figure 3Q:
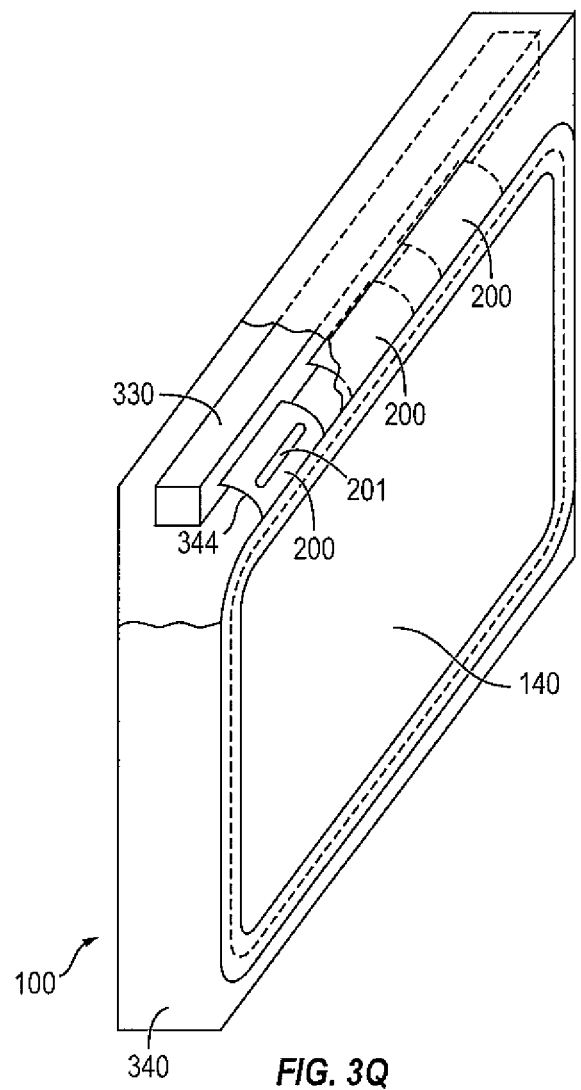

FIGS. 3A-3Q illustrate, in relation to FIGS. 1 and 2, further detail of the display device 100 and the IC assemblies 200, and a method or process of making the same, according to some embodiments of the present invention. Referring to FIG. 3A, an IC assembly 200 includes a flexible substrate 202. The flexible substrate 202 may be formed of one or more layers of any suitable flexible substrate material (e.g., polyimide film) capable of operating as a thin film flexible substrate to which an IC chip can be mounted. According to some embodiments of the present invention, the flexible substrate 202 may be an electrically insulating material. The flexible substrate 202 includes a plurality of input traces 204 (e.g., similar to or the same as the input traces IT of FIG. 2) electrically connected between data pads 206 and data pads 208. The data pads 206 are configured to be electrically connected to a data source (e.g., the incoming data lines ID of FIG. 2) for receiving input data 210. The input traces 204 transmit data signals received at the data pads 206 to the data pads 208. As will be described in more detail below, the data pads 208 are configured to be connected to input pads on an IC chip (e.g., the IC chip 201).

The flexible substrate 200 further includes a plurality of output traces 220 (e.g., similar to or the same as the output traces OT of FIG. 2) electrically connected between data pads 222 and data pads 224. As will be described in more detail below, the data pads 224 are configured to be connected to output pads on an IC chip (e.g., the IC chip 201). The output traces 220 transmit data signals received at the data pads 224 to the data pads 222. The data pads 222, in turn, are configured to be electrically connected to other components of the display device 100 (e.g., a data line from among the data lines) to transmit the output data signals 226 from the IC chip to the other components.

According to some embodiments of the present invention, the flexible substrate 202 may be formed, according to any suitable flexible substrate manufacturing technique known in the art, to include one or more layers of insulating material in which the input traces 204 and the output traces 220 are embedded or layered therebetween. That is, the input traces 204 and the output traces 220 may be electrically insulated by the insulating material of the flexible substrate 202 such that only the data pads 206, 208, 224, and 222 are exposed through or on top of the insulating material of the flexible substrate 202. According to another embodiment, the input traces 204 and the output traces 220 may be formed or deposited, according to any suitable flexible substrate manufacturing technique known in the art, to be positioned on top of the insulating material of the flexible substrate 202.

In FIG. 3B, a flexible thermally conductive layer or film 230 is positioned or deposited on the flexible substrate 202. The thermally conductive layer 230 may be formed of any suitable thermally conductive film or foil, and may include one or more layers of metal such as Al, Cu, Au, Ag, carbon, a thermally conductive composite material, or any other suitable flexible thermally conductive thin film material such as soft-silicone. In some embodiments, in which the thermally conductive layer 230 is also electrically conductive, and the traces 204 and 220 are exposed on top of the flexible substrate 202, an insulating material, such as an electrically insulating adhesive material, may be positioned between the substrate 202 and the thermally conductive layer 230. The thermally conductive layer 230 may be positioned or deposited on the flexible substrate 202 using any suitable technique. For example, according to some embodiments, the thermally conductive layer 230 may be a preformed or premanufactured thermally conductive film or foil mechanically secured to the flexible substrate 202 (e.g., by way of an intervening adhesive material). According to some embodiments, the thermally conductive layer 230 may instead be deposited over the flexible substrate 202 using any suitable deposition method such as physical vapor deposition, chemical vapor deposition, printing, sputtering, plating, etc., to form a thin film of the thermally conductive layer 230 on the flexible substrate 202.

As shown in FIG. 3B, the thermally conductive layer 230 may include an opening 232 aligned with (e.g., aligned around) the data pads 208 such that the data pads 208 are exposed through the thermally conductive layer 230 for subsequent electrical connection to an IC chip. Additionally, the thermally conductive layer 230 may include an opening 234 aligned with (e.g., aligned around) the data pads 224 such that the data pads 224 are also exposed through the thermally conductive layer 230 for subsequent electrical connection to an IC chip. Additionally, as illustrated in FIG. 3B, the thermally conductive layer 230 may overlap or extend across (e.g., cover) the traces 204 and 220. According to embodiments in which the thermally conductive layer 230 overlaps the traces 204 and 220, and the traces 204 and 220 are layered on top of the flexible substrate 202, as discussed above, an intervening insulating material (e.g., an adhesive insulating material) may be positioned between the flexible substrate 202 (and the traces 204 and 220) and the thermally conductive layer 230. Like the flexible substrate 202 and the thermally conductive layer 230, such an intervening insulating material is flexible rather than rigid.

The thermally conductive layer 230 may extend across the surface of the flexible substrate 202, including a strip or region 236 between the data pads 208 and the data pads 224. According to some embodiments, a peripheral region of the surface of the flexible substrate may be exposed (as illustrated in FIG. 3B), but according to other embodiments, the thermally conductive layer 230 may extend to the edge of the flexible substrate 202.

According to some embodiments, as illustrated in FIG. 3C, the thermally conductive layer 230 may include an opening 240 where the traces 204 are located and an opening 242 where the traces 220 are located. Thus, according to some embodiments of the present invention, the thermally conductive layer 230 may not overlap the traces 204 and the traces 220, and instead may have a shape or footprint that extends around the periphery of the area where the traces 204 and 220 are located. In such embodiments, the thermally conductive layer 230 may extend over a strip or region 246 between the data pads 208 and 224. Alternatively, as illustrated in FIG. 3D, the thermally conductive layer 230 may be removed or separated at an area 250 between the data pads 208 and 224. Accordingly, in some embodiments, the thermally conductive layer 230 may be divided or separated into two or more distinct sections 230a and 230b. The number of sections is not limited to 1 or 2, however, and embodiments of the present invention may include any suitable number of distinct and separate sections of the thermally conductive layer 230 according to the design and function of the IC assembly 200.

As illustrated in FIG. 3E, rather than being a continuous layer or film of material as illustrated in FIGS. 3B-3D, according to some embodiments of the present invention, the thermally conductive layer 230 may additionally be formed in a mesh or webbed configuration that includes a plurality of overlapping or interwoven strands of thermally conductive material and a plurality of openings between the strands. Such thermally conductive layers with a mesh structure or geometry may enable improved convection for ambient area due to the non-continuous or rough surface area. Although the thermally conductive layer 230 having the mesh configuration is illustrated in FIG. 3E as having the same or similar shape or layout (e.g., outline) as the thermally conductive layer 230 in FIG. 3D, the mesh configuration of the thermally conductive layer 230 may be applied to any alternative shapes or layouts, such as those discussed above with respect to FIGS. 3B-3D.

For brevity and to avoid repetitive description, FIGS. 3F-3I and 3K illustrate a cross-section perspective of a process for manufacturing or forming an IC assembly 200 taken along the line I-I of FIGS. 3B-3E, Thus, the process illustrated in FIGS. 3F-3I and 3K can be applied to any of the configurations described in FIGS. 3B-3E. Referring to FIG. 3F, the IC assembly 200 includes the thin film flexible substrate 202. The data pads 224 are exposed through the thermally conductive layer 230 on a top surface of the flexible substrate 202. Although not illustrated in FIG. 3F, as discussed above, the data pads 208 are similarly exposed through the thermally conductive layer 230 on a top surface of the flexible substrate 202. According to some embodiments of the present invention, as discussed above, the thermally conductive layer 230 may be a preformed thermally conductive film that is mechanically attached to the flexible substrate, for example, using an adhesive material between the flexible substrate 202 and the thermally conductive layer 230. Alternatively, the thermally conductive layer 230 may be deposited on the flexible substrate 202 using any suitable deposition process known in the art.

As shown in FIGS. 3G-3I, the IC chip 201 is mounted to the flexible substrate 202 over the data pads 208 (shown, e.g., in FIG. 3A) and the data pads 224 and the thermally conductive layer 230. An electrically conductive bump material is deposited on data pads of the IC chip 201 (discussed in more detail below) and/or the data pads 208 and 224 to form electrically conductive bumps 266. The bump material of the bumps 266 may be deposited using any suitable bump material deposition process such as a soldering, evaporation, electrolytic plating, electroless plating, ball drop, or screen printing process. The bump material of the bumps 266 may be any suitable electrically conductive material such as Aluminum (Al), Tin (Sn), Nickel (Ni), Gold (Au), Silver (Ag), Lead (Pb), Bismuth (Bi), Copper (Cu), solder, etc., and combinations thereof, with an optional flux solution. The bumps 266 are bonded to the data pads of the IC chip 201 (discussed in more detail below) and the data pads 224 and 208 using any suitable attachment or bonding process (e.g., by heating the bump material of the bumps 266 above its melting point to form balls or bumps 266, compression bonding, etc.). The bumps 266 represent one type of interconnect structure that can electrically connect the data pads 224 and 208 on the flexible substrate 202 to the data pads of the IC chip 201. The interconnect structure can also use stud bump, micro bump, or any other suitable electrical interconnect.

Referring to FIG. 3G, prior to mounting the IC chip 201 to the flexible substrate 202, a flexible thermally conductive layer 260 may be positioned or deposited on the thermally conductive layer 230 and/or the bottom surface of the IC chip 201 such that, after the IC chip 201 is mounted to the flexible substrate 202, a top surface of the thermally conductive layer 260 is in direct contact with the bottom surface of the IC chip 201, and a bottom surface of the thermally conductive layer 260 is in direct contact with the top surface of the thermally conductive layer 230. The thermally conductive layer 260 may be formed of any suitable thermally conductive film or foil, and may include one or more layers of metal such as Al, Cu, Au, Ag, a thermally conductive composite material, a thermally conductive adhesive material, or any other suitable thermally conductive material or thermally conductive film such as soft-silicone. According to some embodiments of the present invention, the thermally conductive layer 260 may be self-adhesive, or may include a thermally conductive adhesive material on one or both sides to enable mechanical connection between the thermally conductive layer 260 and the IC chip 201 and/or the thermally conductive layer 230. Because the thermally conductive layer 260 is in direct physical contact with the IC chip 201 and the thermally conductive layer 230, during operation of the IC chip 201, thermal energy or heat may be conducted or transferred from the IC chip 201 through the thermally conductive layer 260 to the thermally conductive layer 230, thereby enabling heat to be dissipated out of the IC chip 201 into the thermally conductive layer 230.

Referring to FIG. 3H, according to some embodiments of the present invention, prior to mounting the IC chip 201 to the flexible substrate 202, a plurality of thermally conductive bumps 270 may be deposited to correspond to thermal pads of the IC chip 201 (discussed in more detail below). The thermally conductive bumps 270 may be formed of any suitable thermally conductive material such as Al, Sn, Ni, Au, Ag, Pb, Bi, Cu, solder, and combinations thereof, with an optional flux solution, and may be deposited according to any suitable deposition method, such as the methods discussed above with respect to the bumps 266. Alternatively, the thermally conductive bumps 270 may be formed as thermally conductive pillars or posts deposited (e.g., on the thermal pads of the IC chip 201 and/or the thermally conductive layer 230) to correspond to thermal pads of the IC chip 201. Thus, the IC chip 201 may be thermally connected to the thermally conductive layer 230 by way of the bumps 270. Accordingly, thermal energy or heat may be conducted or transferred from the IC chip 201 through the thermally conductive bumps 270 to the thermally conductive layer 230, thereby enabling heat to be dissipated out of the IC chip 201 into the thermally conductive layer 230.

Referring to FIG. 3I, according to some embodiments of the present invention, the thermally conductive layer 230 may have a thickness T sufficient such that a top surface of the thermally conductive layer 230 is in thermal contact with a bottom surface of the IC chip 201. That is, the thickness T of the thermally conductive layer 230 may be equal (or approximately equal) to the distance between the bottom surface of the IC chip 201 and the top surface of the flexible substrate 202. For example, according to one embodiment, the thermally conductive layer 230 may be in direct physical contact with the bottom surface of the IC chip 201 (and/or thermal pads of the IC chip 201). According to another embodiment, the thickness T of the thermally conductive layer 230 may be approximately equal to the gap between the IC chip 201 and the flexible substrate 202, but one or more thermally conductive adhesive layers may be positioned on surfaces of the thermally conductive layer 230 to provide additional mechanical connectivity between the thermally conductive layer 230 and the IC chip 201 and/or the flexible substrate 202. According to embodiments in which the thickness T of the thermally conductive layer 230 is equal or approximately equal to the gap between the IC chip 201 and the flexible substrate 202, the thickness T is not great enough to cause the thermally conductive layer 230 to become overly rigid. That is, according to each of the embodiments of the present invention, the IC assembly 200 remains flexible in order to enable the IC assembly 200 to conform to limited space within a housing of the display device 100.

FIG. 3J illustrates a bottom surface (e.g., the surface facing the flexible substrate 202) of the IC chip 201, taken along the line II-II of FIG. 3H, although the disclosure of FIG. 3J applies to each of the example embodiments of the present invention described above. As shown in FIG. 3J, the IC chip 201 includes a plurality of output data pads 280 and a plurality of input data pads 282. After mounting the IC chip 201 to the flexible substrate, as illustrated by the process shown in FIGS. 3A-3I, the output data pads 280 correspond to (e.g., align with) the data pads 224, and the input data pads 282 correspond to (e.g., align with) the data pads 208. Accordingly, as discussed above, input data may be transmitted from the data source (e.g., the timing controller 110) to the input data pads 206, through the traces 204, to the pads 208, and then to the input data pads 282 of the IC chip 201. The IC chip 201 then processes (e.g., de-serializes or de-multiplexes) the input data to generate output data. The output data is then transmitted from the output data pads 280 of the IC chip 201 to the data pads 224, through the traces 220, and to the data pads 222 where it may be transmitted as output data to external components (e.g., the data lines DL1 through DLj).

Additionally, the IC chip 201 includes a PHY area 286, where high speed interface circuits for processing (e.g., de-serializing or de-multiplexing) the input data into output data are located. Accordingly, the PHY area 286 may be a location at which a significant portion of the heat generated by the IC chip 201 originates, due to the high rate of data that may pass through the PHY area 286. The PHY area 286 may be relatively small (e.g., approximately ¼ the width) compared to the area of the IC chip 201. For example, the PHY area 286 may be approximately 5 mm wide for an IC chip 201 that is approximately 20 mm wide. Thus, because of the relatively high density and high data rate at the PHY area 286, a relatively significant amount of heat may be generated at and around the PHY area 286.

Thus, according to some embodiments of the present invention, a plurality of thermal pads 290 may be positioned or distributed across the bottom surface of the IC chip 201, including in the area around the periphery of the PHY area 286. Although FIG. 3J illustrates the thermal pads 290 being positioned outside the PHY area 286, according to some embodiments of the present invention, one or more thermal pads 290 may also be located within the perimeter of the PHY area 286. The thermal pads 290 may be made of a thermally conductive material for facilitating transmission of heat out of the IC chip 201.

As shown in FIG. 3K, after mounting the IC chip 201 to the flexible substrate 202, an underfill material may be deposited under and/or around the IC chip 201, using any suitable underfill process known in the art, to prevent or reduce instances of contaminants contacting an active surface of the IC chip 201 or interfering with the electronic circuitry of the IC assembly 200. For example, an underfill applicator 300 may be utilized to inject underfill material 302, in a liquid or semi-liquid state, into the open space or gap between the IC chip 201 and the flexible substrate 202, around the bumps (e.g., the bumps 266 and 270), and around the peripheral edges of the IC assembly 200. The underfill material may include any suitable underfill material such as an encapsulant, molding compound, polymer composite material such as epoxy resin with filler, epoxy acrylate with filler, etc. Although for the purposes of brevity and avoiding repetitive description FIG. 3K illustrates an embodiment continuing from FIG. 3H, a person having ordinary skill in the art will appreciate that the underfill process described in FIG. 3K may be applied to any other configuration or embodiment of the present invention, including FIGS. 3G and 3I.

FIGS. 3L-3P illustrate a top view of the IC assembly 200 after mounting the IC chip 201 to the flexible substrate 202. Although for the purposes of brevity and avoiding repetitive description the embodiments illustrated in FIGS. 3L-3P include the thermally conductive layer 230 with the configuration as described with respect to FIG. 3D; a person having ordinary skill in the art will appreciate that the description of FIG. 3L may be applied to any of the configurations of the thermally conductive layer 230 described above with respect to FIGS. 3A-3I.

As shown in FIG. 3L, and as described above, after mounting the IC chip 201 to the flexible substrate 202, the IC chip 201 may overlap with and be in thermal contact with the thermally conductive layer 230. Accordingly, the configuration of the IC assembly 200 may enable heat generated by the IC chip 201 during operation of the display device 100 to be dissipated out of the IC chip 201 and spread across the surface area of the thermally conductive layer 230. Additionally, the thermally conductive layer 230, when positioned or deposited on the thin film flexible substrate 202 is thin enough to enable both the thermally conductive layer 230 and the thin film flexible substrate 202 to remain flexible. Thus, after mounting the IC chip 201 on the flexible substrate 202, the IC assembly 200 may remain flexible in areas outside the footprint or perimeter of the IC chip 201, thereby enabling the IC assembly 200 to be flexed to conform to various tight spaces within a display device housing (discussed in more detail below).

According to some embodiments of the present invention, a thermally conductive layer 310 may be positioned on a top surface of the IC chip 201, as illustrated in FIGS. 3M and 3N. The thermally conductive layer 310 may be any suitable thermally conductive material as described above with respect to the thermally conductive layer 230, and may be mechanically attached to the thermally conductive layer 230 and/or the top surface of the IC chip 201 by any suitable means. For example, the thermally conductive layer 310 may be in direct contact with the IC chip 201 and/or the thermally conductive layer 230, or an intervening thermally conductive material (e.g., a thermally conductive adhesive material, a thermally conductive solder material, etc.) may be positioned between the thermally conductive layer 310 and the IC chip 201 and/or the thermally conductive layer 230. Thus, according to some embodiments of the present invention, the thermally conductive layer 310 may be contoured around the edges of the IC chip 201 and the junction between the thermally conductive layer 230 and the IC chip 201.

Additionally, as shown in FIG. 3M, the thermally conductive layer 310 may include a solid (e.g., non-mesh) region 312 overlapping (or covering) the IC chip 201. Additionally, the thermally conductive layer 310 may include a mesh area 314 around or outside the periphery of the solid region 312 (and/or outside the periphery of the IC chip 201). Thus, according to some embodiments, the thermally conductive layer 310 may include both a solid (or non-mesh) region 312 and a mesh region 314. Alternatively, as illustrated in FIG. 3N, the thermally conductive layer 310 may include only solid (e.g., non-mesh) material, or may be mesh material across the entirety of the thermally conductive layer 310.

According to some embodiments, as illustrated in FIGS. 3M and 3N, the thermally conductive layer 310 on top of the IC chip 201 may not extend to cover the entire surface of the thermally conductive layer 230, and an area outside the periphery of the thermally conductive layer 310 may remain exposed. Alternatively, as illustrated in FIGS. 3O and 3P, a thermally conductive layer 320 may be positioned or formed over the top surface of the IC chip 201 to cover or overlap the entire surface of an underlying thermally conductive layer (e.g., the thermally conductive layer 230). The thermally conductive layer 320 may be any suitable thermally conductive material as, described above with respect to the thermally conductive layer 230, and may be mechanically attached to the thermally conductive layer 230 and/or the top surface of the IC chip 201 by any suitable means, as discussed above. Additionally, according to some embodiments of the present invention, the thermally conductive layer 230 may be omitted, and the thermally conductive layer 320 may be mechanically connected to the flexible substrate 202 without an intervening thermally conductive layer 230. Additionally, as illustrated in FIG. 3O, the thermally conductive layer 320 may be a solid (e.g., a non-mesh) thermally conductive material. Alternatively, the thermally conductive layer 320 may include a mesh structure or configuration. According to some embodiments, as illustrated in FIG. 3P, the thermally conductive layer 320 may include a solid (e.g., non-mesh) region 324 at the IC chip 201 (e.g., within a footprint or peripheral area of the IC chip 201) and a mesh configuration or region outside of the solid region 324.

Thus, according to various embodiments of the present invention, an IC assembly 200 may include an IC chip 201 mounted on a thin film flexible substrate 202. Because the thin film flexible substrate 202 may be an electrically insulating material, and may also be a relatively poor thermal conductor, the IC assembly 200 may further include one or more thermally conductive layers 230, 260, 310, and 320 that are in thermal contact with the IC chip 201. Accordingly, during operation of a display device 100 including the IC assembly 200, the thermally conductive layers of the IC assembly 200 may enable heat to be dissipated from the IC chip 201 to one or more of the thermally conductive layers 230, 260, 310, and 320. The surface area of the thermally conductive layers may be greater than that of the IC assembly 200, thereby enabling the heat to be dissipated into the ambient air within the housing of the display device 100, thereby preventing or reducing instances of overheating of the IC chip 201. Accordingly, the heat dissipation limits of an integrated circuit in a chip-on-film package may be extended or expanded, thereby enabling the integrated circuit (e.g., such as driver integrated circuits) to operate at high data transmission rates to support ultrahigh resolution display devices.

Additionally, because the housing of modern display devices may be relatively small, there may be limited space in which to fit an IC assembly. Embodiments of the present invention, however, enable the IC assembly 200 to conform or flex to fit into the relatively small housing of the display device 100, because the flexible substrate 202 and the thermally conductive layers (e.g., the thermally conductive layers 230, 260, 310, and 320) remain flexible outside the footprint of the IC chip 201 after the IC assembly 200 is manufactured. That is, the IC assembly 200 may be flexed or bent outside of the footprint of the IC chip 201 without damaging the mechanical or electrical connections of the IC assembly 200.

For example, as illustrated in FIG. 3Q, the IC assembly 200 may be connected at one end to the display panel 140 of the display device 100, and connected at another end to another electronic device or component 330 (e.g., the timing controller 110). The profile or thickness of the housing 340 of the display device 100 may be relatively slim or thin, however, leaving limited space to fit the IC assembly 200 and the component 330 within the housing 340. Thus, according to embodiments of the present invention, because the IC assembly 200 may be flexed, curved, or bent without damaging the electrical or mechanical connections of the IC assembly 200, the flexed IC assembly 200 may have one or more flexed or curved edges 344 after being installed within the housing 340. Thus, embodiments of the present invention enable the IC assembly to conform to fit in the relatively small or limited space within the housing 340 of the display device 100.

While this disclosure has been described in connection with what is presently considered to be practical example embodiments of the present invention, it is to be understood that the present invention is not limited to the disclosed embodiments, but; on the contrary, is intended to cover various suitable modifications and equivalent arrangements included within the spirit and scope of the appended claims and their equivalents.

What is claimed is:

1. A display device comprising:
   a display panel;
   an electronic component; and
   an integrated circuit (IC) assembly coupled between the electronic component and the display panel, the IC assembly comprising:
   a flexible substrate;
   a first flexible thermally conductive layer on the flexible substrate; and
   an IC chip on the flexible substrate, wherein the IC chip is thermally coupled to, and electrically isolated from, the first flexible thermally conductive layer, and the flexible substrate and the first flexible thermally conductive layer remain flexible outside a footprint of the IC chip such that the flexible substrate and the first flexible thermally conductive layer are flexed between the electronic component and the display panel.

2. The display device of claim 1, wherein the first flexible thermally conductive layer is between the IC chip and the flexible substrate.

3. The display device of claim 1, further comprising a thermally conductive material in contact with a surface of the IC chip and a surface of the first flexible thermally conductive layer.

4. The display device of claim 3, wherein the thermally conductive material comprises a thermally conductive bump.

5. The display device of claim 3, wherein the thermally conductive material comprises a second flexible thermally conductive layer.

6. The display device of claim 1, wherein the first flexible thermally conductive layer comprises a mesh structure.

7. The display device of claim 1, further comprising a second flexible thermally conductive layer on the IC chip such that the IC chip is between the first flexible thermally conductive layer and the second flexible thermally conductive layer.

8. The display device of claim 7, wherein the second flexible thermally conductive layer comprises a mesh structure.

9. The display device of claim 8, wherein the second flexible thermally conductive layer comprises a solid region overlapping the IC chip with the mesh structure located outside the solid region.

10. The display device of claim 1, further comprising a housing, wherein the IC assembly is configured to be flexed to fit within the housing without damaging mechanical and electrical connections of the IC assembly.

11. An integrated circuit (IC) assembly comprising:
    a flexible substrate;
    a first flexible thermally conductive layer on the flexible substrate; and
    an IC chip on the flexible substrate, wherein the IC chip is thermally coupled to, and electrically isolated from, the first flexible thermally conductive layer, and the flexible substrate and the first flexible thermally conductive layer remain flexible outside a footprint of the IC chip such that the flexible substrate and the first flexible thermally conductive layer are flexed between an electronic component and a display panel.

12. The IC assembly of claim 11, wherein the first flexible thermally conductive layer is between the IC chip and the flexible substrate.

13. The IC assembly of claim 11, further comprising a thermally conductive material in contact with a surface of the IC chip and a surface of the first flexible thermally conductive layer.

14. The IC assembly of claim 11, wherein the first flexible thermally conductive layer comprises a mesh structure.

15. The IC assembly of claim 11, further comprising a second flexible thermally conductive layer on the IC chip such that the IC chip is between the first flexible thermally conductive layer and the second flexible thermally conductive layer.

16. A method of making an integrated circuit (IC) assembly, the method comprising:

positioning a first flexible thermally conductive layer on a flexible substrate;

mounting an IC chip on the flexible substrate;

thermally connecting the IC chip to the first flexible thermally conductive layer, wherein the IC chip is electrically isolated from the first flexible thermally conductive layer such that current does not flow therebetween, and the flexible substrate and the first flexible thermally conductive layer remain flexible outside a footprint of the IC chip;

connecting the IC assembly between an electronic component and a display panel such that the flexible substrate and the first flexible thermally conductive layer are flexed between the electronic component and the display panel.

17. The method of claim 16, wherein the first flexible thermally conductive layer is between the IC chip and the flexible substrate.

18. The method of claim 16, further comprising positioning a thermally conductive material in contact with a surface of the IC chip and a surface of the first flexible thermally conductive layer.

19. The method of claim 16, further comprising positioning a second flexible thermally conductive layer on the IC chip such that the IC chip is between the first flexible thermally conductive layer and the second flexible thermally conductive layer.

20. The method of claim 16, further comprising:

flexing the IC assembly into a flexed IC assembly without damaging mechanical and electrical connections of the IC assembly; and mounting the flexed IC assembly within a housing of a display device.

\* \* \* \* \*